(12) United States Patent
Goldenberg

(10) Patent No.: US 6,737,913 B2
(45) Date of Patent: May 18, 2004

(54) DIFFERENTIAL MODE CIRCUITRY AND METHOD OF CALIBRATING SAME WITHOUT MATCHED EXTERNAL CURRENT SOURCES

(75) Inventor: Marius Goldenberg, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 09/882,938

(22) Filed: Jun. 15, 2001

(65) Prior Publication Data
US 2003/0025559 A1 Feb. 6, 2003

(51) Int. Cl.⁷ .............................................. G01R 19/00
(52) U.S. Cl. ................................. 330/2; 330/258
(58) Field of Search ............................ 330/2, 9, 258, 330/259

(56) References Cited

U.S. PATENT DOCUMENTS 5,668,468 A * 9/1997 Cargill ...................... 330/258
5,736,880 A * 4/1998 Bruccoleri et al. .......... 327/536

* cited by examiner

Primary Examiner—Khanh Van Nguyen
(74) Attorney, Agent, or Firm—Davis & Associates; William D. Davis

(57) ABSTRACT

A common mode feedback circuit includes first and second nodes defining a differential node pair. A collective plurality of transconductors includes a first plurality of transconductors associated with the first node and a second plurality of transconductors associated with the second node. Each plurality, for example, may consist of 2 transconductors such that one may be serve as a common mode current sink and the other may be operated as a current source during calibration. At least one transconductor of the collective plurality has an adjustable transconductance. In various embodiments, each node has at least one transconductor with an adjustable transconductance. The common mode feedback circuit includes a calibration engine. The calibration engine adjusts at least one adjustable transconductor until a sensed differential voltage across the differential node pair is substantially zero without the use of external current sources.

20 Claims, 6 Drawing Sheets

DIFFERENTIAL MODE CIRCUITRY AND METHOD OF CALIBRATING SAME WITHOUT MATCHED EXTERNAL CURRENT SOURCES

FIELD OF THE INVENTION

This invention relates to the field of circuit design. In particular, this invention is drawn to common mode feedback circuits and methods of calibrating such circuits to minimize the common mode current to differential mode voltage conversion factor.

BACKGROUND OF THE INVENTION

Common mode feedback circuits are routinely incorporated into the design of differential circuits when a differential pair of signal nodes must present a low impedance to common mode excitation without significantly affecting the differential mode excitation of the circuitry. Asymmetries within the common mode feedback circuit, however, may impair the common mode feedback circuit ability to reject common mode signals. This results in degradation of the performance of the differential circuitry.

In order to improve the performance of the differential circuitry, the common mode feedback circuit may be designed as an adjustable component of the differential circuitry. The common mode feedback circuit is adjusted or calibrated to maximize rejection of the common mode component of any signal presented to a differential node pair of the differential circuitry.

Typically, adjusting or tuning of the common mode feedback circuit requires the application of a matched pair of signal sources (e.g., current sources) to the differential node pair. The primary disadvantage of this approach is the requirement for highly matched external current sources. The calibration of the common mode feedback circuitry is limited by the precision of matching between the external current sources.

Another approach calibrates the common mode feedback circuitry based on the external current sources and memorizes the result. The differential nodes are then switched so that the current sources are now presented to the complementary nodes as compared with the first calibration run. A second calibration now calibrates the common mode feedback circuitry based on the swapped current sources. The calibration mechanism then attempts to find an optimum adjustment based on the two stored calibration results. Although this approach is less reliant on precise matching of the external current sources, the calibration procedure and calibration engine are necessarily more complex.

SUMMARY OF THE INVENTION

A common mode feedback circuit includes first and second nodes defining a differential node pair. A collective plurality of transconductors includes a first plurality of transconductors associated with the first node and a second plurality of transconductors associated with the second node. At least one transconductor of the collective plurality has an adjustable transconductance. In one embodiment, each node has at least one transconductor with an adjustable transconductance. The nominal transconductance of each of the transconductors within a selected plurality is substantially the same.

The common mode feedback circuit may further include a calibration engine. While in a calibration mode, the calibration engine adjusts at least one adjustable transconductor until a sensed differential voltage across the differential node pair is substantially zero without the use of external current sources. When switched to a normal mode, the calibration fixes the adjustable transconductance values to prevent further adjustments.

In various embodiments, the common mode feedback block including the calibration engine resides on an integrated circuit semiconductor die. In one embodiment, the common mode feedback block is fabricated as a complementary metal oxide semiconductor (CMOS) integrated circuit.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
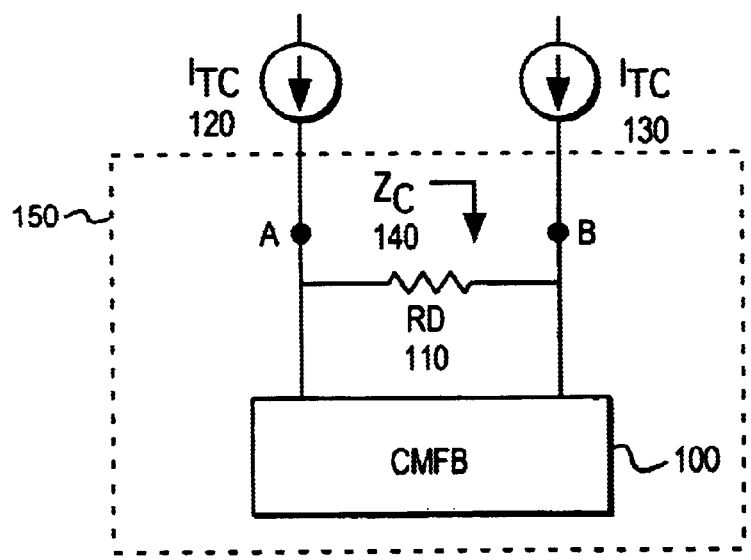
FIG. 1 illustrates common mode application of matched current source pair to differential circuitry incorporating a common mode feedback block.
Figure 2:
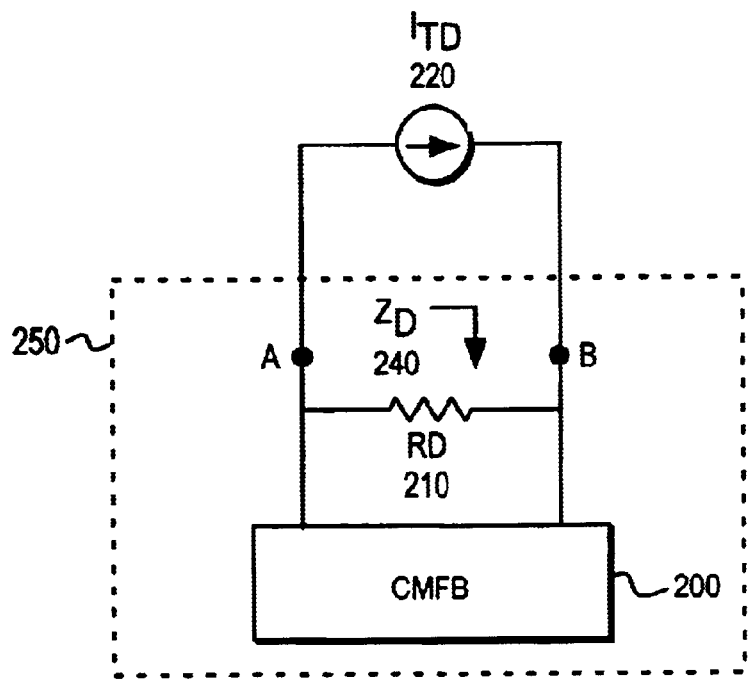
FIG. 2 illustrates differential mode application of a current source to the differential circuitry.

FIG. 1 illustrates a differential circuit 150 incorporating a common mode feedback block 100. The CMFB circuit is predominantly responsible for establishing a low common mode impedance, $Z_C$ 140. For a common mode impedance test, two identical currents ($I_{TC}$ 120, $I_{TC}$ 130) are injected into the differential nodes A and B. FIG. 2 illustrates the same differential circuit 250 with CMFB 200 undergoing a differential mode impedance test with current source $I_{TD}$ 220. The impedance $Z_D$ 240 seen by current source 220 is dominated by RD 210.

The CMFB circuit is employed as a low impedance sink for unwanted common mode currents, thus increasing the overall common mode rejection abilities of the differential circuit. Asymmetries within the CMFB circuit, however, can cause a pure common mode current to result in an unwanted differential voltage between the CMFB nodes A and B. The differential voltage is indistinguishable from the intended differential signal and will be processed with the expected differential signal. This mechanism is a significant source of signal degradation in differential circuits and may be quantified by the Common Mode Current to Differential Mode Voltage Conversion Factor, $Z_{CD}$. The conversion factor may be quantified as follows:

$$Z_{CD} = \frac{V_A - V_B}{I_{CM}}$$

Figure 3:
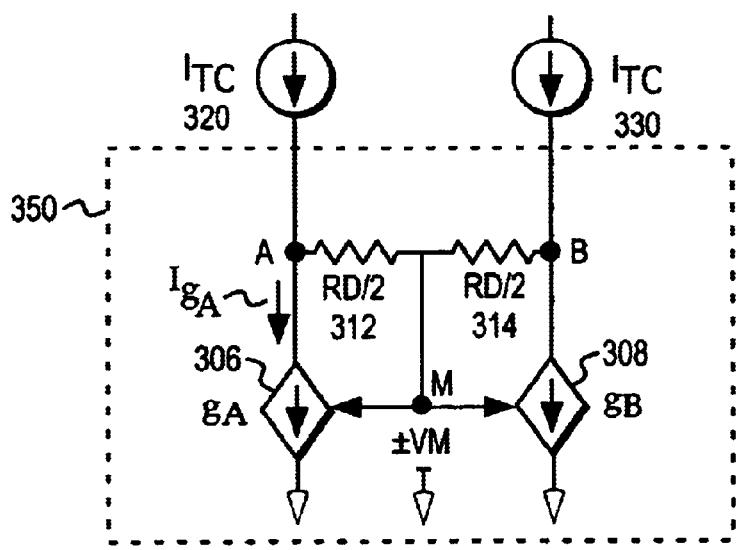
FIG. 3 illustrates a prior art common mode feedback block.

FIG. 3 illustrates a small signal model of a typical CMFB circuit. Current sources 306 and 308 are voltage controlled current sources also referred to as transconductors. Each transconductor has an associated transconductance value ($g_A$, $g_B$). The transconductance values $g_A$ and $g_B$ are identical and the associated current sources are connected to nodes A and B, respectively. The current generated by each current source is the product of the associated transconductance and a control voltage. The control voltage is provided by node M which is established by splitting resistor RD into equal halves and tapping between the halved values. The current sunk by a selected current source may be calculated, for example, as $I_{gA} = g_A \cdot V_M$. Ideally, the resulting control voltage, $V_M$, corresponds to the common mode voltage as follows:

$$V_M = \frac{V_A + V_B}{2}$$

The conversion factor, $Z_{CD}$ is calculated as follows:

$$Z_{CD} = RD \cdot \frac{g_B - g_A}{g_B + g_A}$$

Assuming $g_A = g_B$, then $Z_{CD} = 0$. Otherwise, a non-zero conversion factor results due to the mismatch.

If the relative difference ($\Delta g$) in transconductance values and nominal transconductance value (g) are defined as follows then $$\Delta g \equiv g_B - g_A$$
$$g \equiv \frac{g_A + g_B}{2}$$
then
$$Z_{CD} = \frac{RD}{2} \cdot \frac{\Delta g}{g}$$

Clearly, $Z_{CD}$ increases with the magnitude of any mismatch between $g_A$ and $g_B$.

Figure 4:
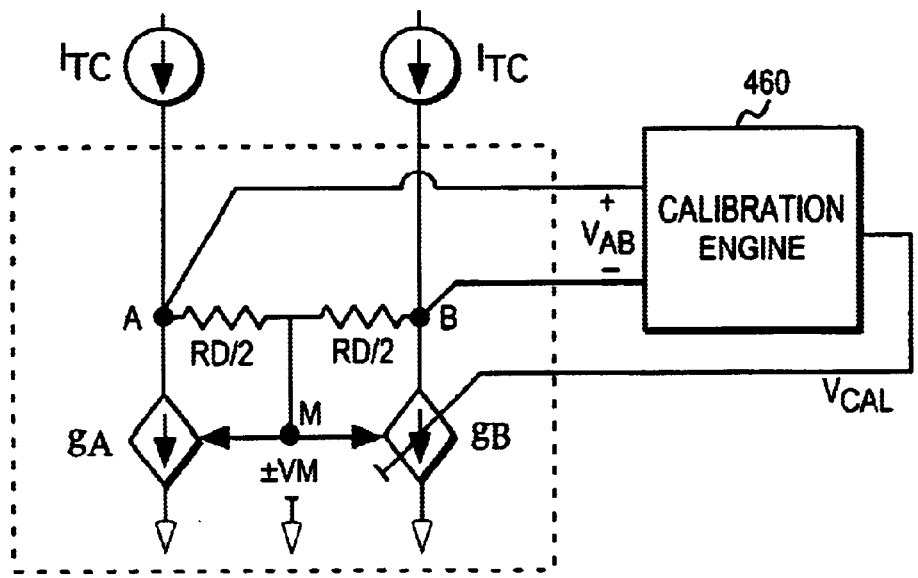
FIG. 4 illustrates a calibration technique for a prior art tunable common mode feedback block.

In order to minimize the $Z_{CD}$ conversion factor, the CMFB may be provided with at least one variable transconductor as illustrated in FIG. 4. A purely common mode pair of AC signal current source, $I_{TC}$ are applied to nodes A and B of the CMFB circuit. Calibration circuit 460 measures the differential voltage between nodes A and B and adjusts the variable transconductor in an attempt to minimize $\Delta g$ (which corresponds to minimizing $V_{AB}$). The calibration result, however, is dependent upon the ability to precisely match the common mode pair of AC signal current sources.

Figure 5:
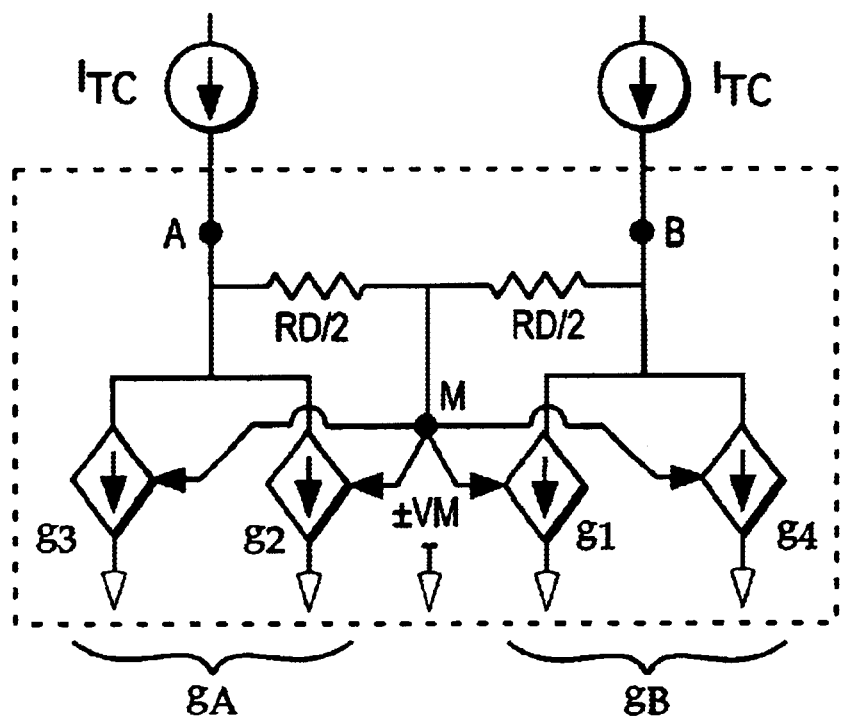
FIG. 5 illustrates one embodiment of a common mode feedback block having a plurality of transconductive elements associated with each differential node.

FIG. 5 illustrates a basic change that enables a more precise calibration to be performed in fewer steps without relying on matched external current sources. Instead of a single transconductor associated with each differential node, a plurality of transconductors is associated with each differential node. Thus a first plurality of transconductors is associated with one differential node and a second plurality of transconductors is associated with the complementary differential node. The first and second pluralities form a collective plurality of transconductors. In various embodiments, one or more transconductors of the collective plurality may have a variable transconductance.

Generally, the transconductors are designed such that the total transconductance value associated with each differential node is nominally halved between the transconductors that are capable of having their associations swapped between the differential node pair and the transconductors that cannot be swapped as described with respect to the calibration process.

Although two transconductors per node are illustrated as an example, alternative embodiments have ratios of the number of swappable to non-swappable transconductors other than 1. For example, three non-swappable transconductors and one swappable transconductor may be provided for each differential node. Assuming each of the non-swappable transconductors has a same nominal value, the swappable transconductor must have a transconductance three times the nominal transconductance of the non-swappable transconductors to ensure halving of the total transconductance between the swappable and non-swappable sets of transconductors.

In the illustrated embodiment each differential node is associated with 2 transconductors. The transconductors associated with a selected node (A) are selected to have approximately a same nominal transconductance such that the total transconductance associated with the selected node is halved between the two transconductors. Thus $$g_A = g_2 + g_3, \text{ where } g_2 \cong g_3 \cong \frac{g_A}{2}, \text{ and}$$

$$g_B = g_1 + g_4, \text{ where } g_1 \cong g_4 \cong \frac{g_B}{2}$$

Figure 6:
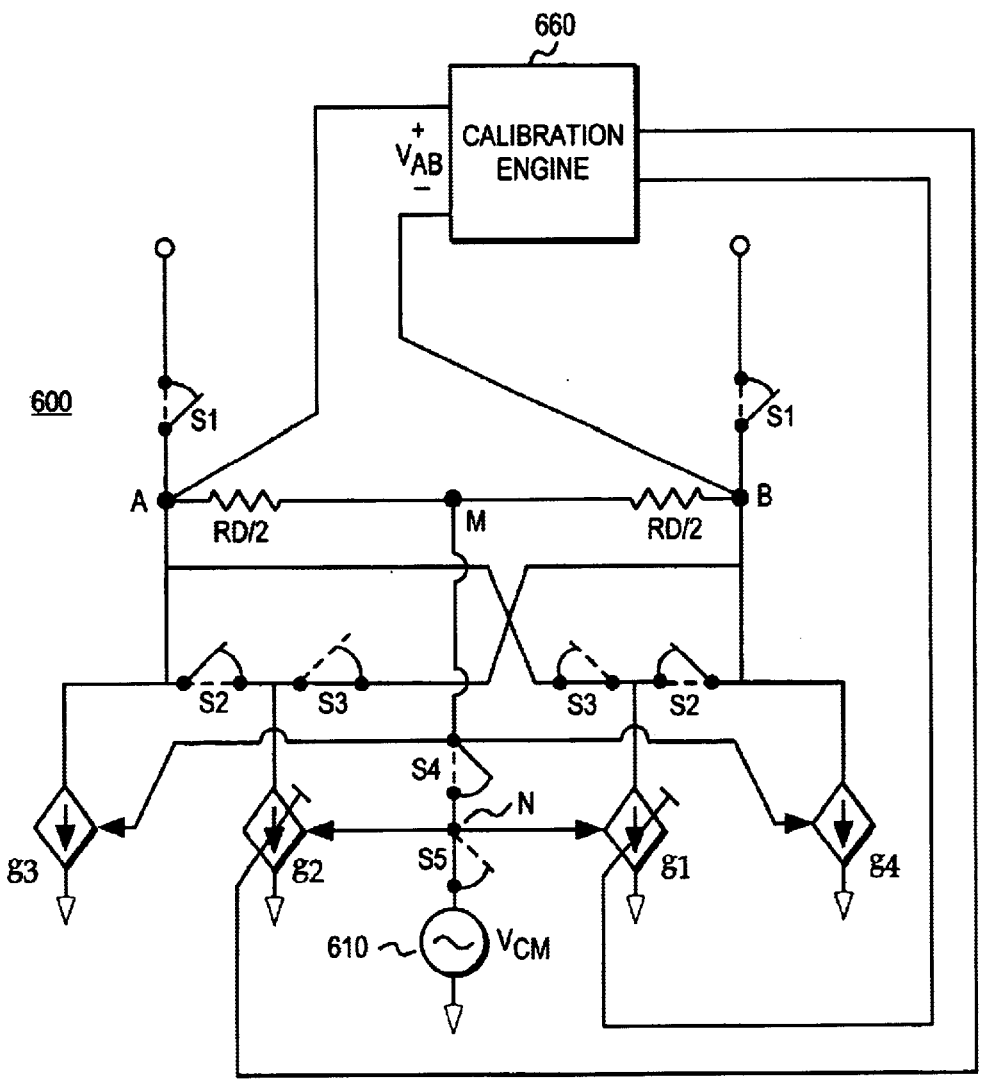
FIG. 6 illustrates a calibration technique for the common mode feedback block of FIG. 5 when switched into calibration mode.

FIG. 6 illustrates the improved CMFB circuit with switches and the calibration engine used for the calibration process including one or more adjustable transconductors. As illustrated, the switches are in calibration mode. In particular, switches S1, S2, and S4 are OFF (i.e., open circuit) and switches S3 and S5 are ON (i.e., closed circuit). At least one of the plurality of transconductors have adjustable transconductances. In the illustrated embodiment, at least one transconductor associated with each differential node has an adjustable transconductance. In particular, transconductance values $g_1$ and $g_2$ are adjustable.

In calibration mode, the calibration engine drives $V_{AB}$ to zero by adjusting $g_1$ and $g_2$. In particular, $g_1$ and $g_2$ are adjusted to the values $\tilde{g}_1$ and $\tilde{g}_2$ until the following proportion is satisfied:

$$\frac{\tilde{g}_1}{\tilde{g}_2} = \frac{g_3}{g_4}$$

In one embodiment, the transconductance values are modified by subtracting a small amount, $\delta$, from $g_2$ and adding it to $g_1$. Thus $$\frac{\tilde{g}_1}{\tilde{g}_2} = \frac{g_1 + \delta}{g_2 - \delta} = \frac{g_3}{g_4}$$

from which δ can be derived as $$\delta = \frac{g_2 g_3 - g_1 g_4}{g_3 + g_4}$$

Although the transconductance associated with each node is halved between the swappable transconductors and the remaining transconductors, there is typically a small "halving" error, $$\frac{\Delta g}{2},$$

due to small differences in the nominal values. A given transconductance, g, is generated by two transconductors having transconductance values of approximately $$\frac{g}{2}.$$

The difference between the nominal values, is split between the transconductors such that one has a transconductance of $$\frac{g + \Delta g}{2}$$

and the other has a transconductance of $$\frac{g - \Delta g}{2}.$$

Previous derivations of $g_A$ and $g_B$ can be rewritten as $$g_A = \left(\frac{g_A}{2} + \frac{\Delta g_A}{2}\right) + \left(\frac{g_A}{2} - \frac{\Delta g_A}{2}\right),$$

where the first and second terms correspond to $g_2$ and $g_3$, respectively, and $$\frac{\Delta g_A}{2}$$

is the halving error for each transconductor associated with node A. Similarly, $$g_B = \left(\frac{g_B}{2} + \frac{\Delta g_B}{2}\right) + \left(\frac{g_B}{2} - \frac{\Delta g_B}{2}\right),$$

where the first and second terms correspond to $g_1$ and $g_4$, respectively and $$\frac{\Delta g_B}{2}$$

is the halving error for each transconductor associated with node B.

The adjustment value δ may be rewritten as $$\delta \approx \frac{g_A^2 - g_B^2}{2(g_A - \Delta g_A + g_B - \Delta g_B)}$$

When the CMFB circuit is switched back to normal mode, $g_1$ and $g_2$ will be fixed at the values determined during calibration (i.e., $\tilde{g}_1$, $\tilde{g}_2$ respectively). This results in a modified $g_A$ and $g_B$ as follows:

$$\tilde{g}_A = \tilde{g}_2 + g_3, \text{ and}$$

$$\tilde{g}_B = \tilde{g}_1 + g_4$$

After substitution and some approximations, the post-calibration conversion factor can be rewritten as $$Z_{CD} = RD \cdot \frac{\tilde{g}_B - \tilde{g}_A}{\tilde{g}_B + \tilde{g}_A} = RD \cdot \left(\frac{g_B - g_A}{g_B + g_A}\right) \cdot \left(\frac{\Delta g_B + \Delta g_A}{g_B + g_A}\right)$$

The first parenthetical term corresponds to the pre-calibration conversion factor. The second parenthetical term corresponds to a halving operation error. Each of these parenthetical terms is of the form $$\frac{\Delta g}{g}.$$

The final conversion factor is thus of the form $$\left(\frac{\Delta g}{g}\right)^2.$$

The improved conversion factor results an a large improvement in accuracy—approximately a doubling in dB or logarithmic terms.

The CMFB circuit is reconfigured using switches S1–S5 such that half of the transconductors are performing to classical CMFB function and the other half are performing the function of common-mode current injection.

Referring to FIG. 6, the circuit is operated in calibration mode as illustrated while calibration engine 660 adjusts $g_1$ and $g_2$ until $V_{AB}=0$. No external current sources are required for calibration. Thus calibration is not dependent or limited by the availability of precisely matched signal current sources. Switch S1 disconnects the differential circuitry from any external signal sources.

Signal source $V_{CM}$ 610 is applied to node N for purposes of calibration. This effectively transforms transconductors corresponding to $g_2$ and $g_1$ into current sources controlled by node N while transconductors corresponding to $g_3$ and $g_4$ are controlled by common mode node M. After calibration the adjusted $g_1$ will offset $g_3$ and the adjusted $g_2$ will offset $g_4$. Signal source $V_{CM}$ 610 may be implemented as an oscillator residing on a same integrated circuit semiconductor dies as the remaining CMFB circuitry. Although power for operating the signal source may be supplied external to any integrated circuit package incorporating the CMFB, the CMFB is not dependent upon external signal sources for calibration.

In one embodiment, the calibration engine provides digital values rather than analog values for adjusting the adjustable transconductive elements. Thus, for example, the calibration engine might store a digital value specific to each adjustable transconductive element in an associated register for that transconductive element. The transconductance values of the adjustable transconductors are set in accordance with the values stored in their respective associated registers.

In one embodiment, the value $V_{CM}$ is selected to be on the same order as the anticipated voltage value or voltage swing of node M. The final calibration and operation of the post-calibrated differential circuitry, however, is independent of $V_{CM}$ 610.

In one embodiment, signal source 610 is operated at a pre-determined frequency, f. The calibration engine 660 may include a filter such as a band pass filter to ensure that adjustments are made only in response to the component of $V_{AB}$ due to the signal source 610. Thus in one embodiment, the calibration engine adjusts one or more transconductance values based on the sensed differential voltage $V_{AB}$ at the pre-determined frequency, f. The calibration engine 660 adjusts the transconductance values until $V_{AB}(f)$ is substantially zero.

Figure 7:
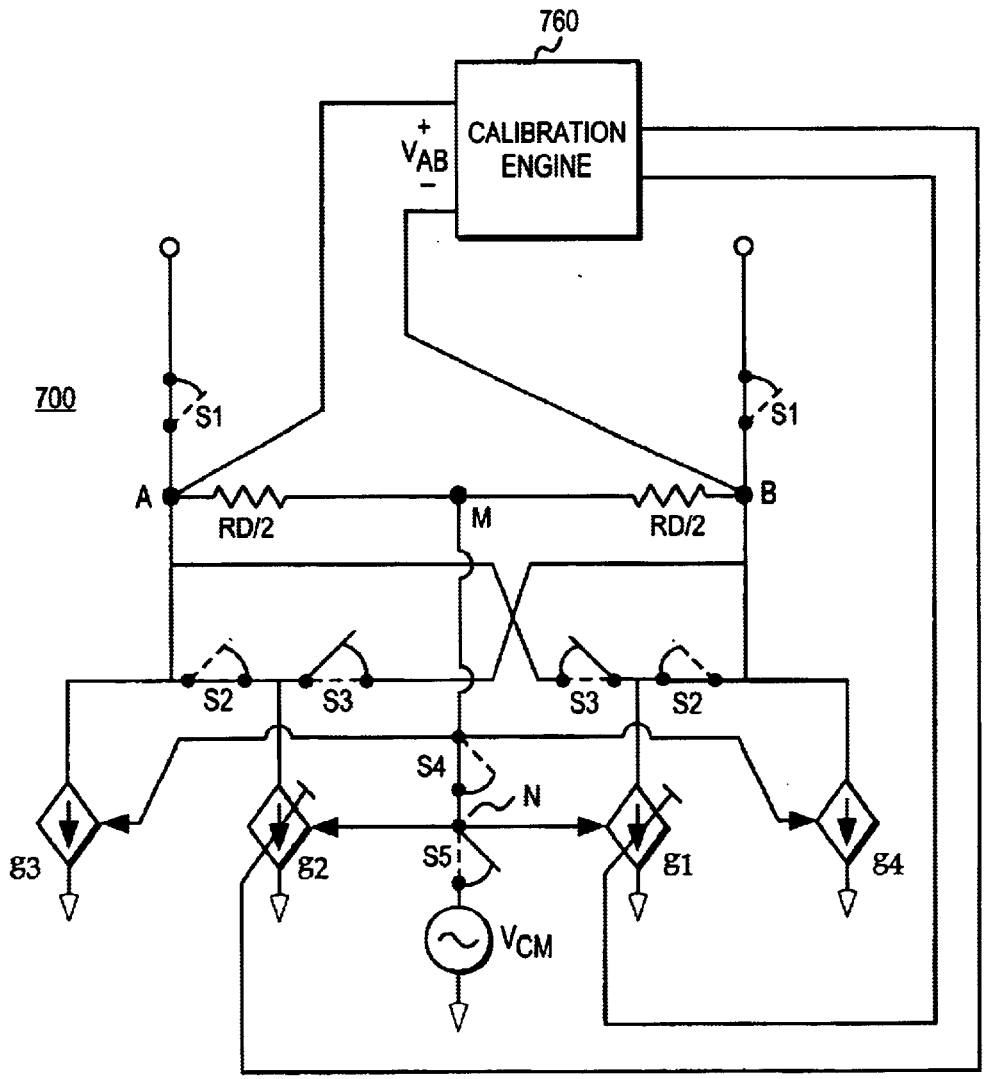
FIG. 7 illustrates toggling of the common mode feedback block of FIG. 5 to normal mode.

After calibration, the switches toggle to normal operation as illustrated in FIG. 7. Calibration engine 760 fixes $g_1$ and $g_2$ at the values determined during the calibration process while the CMFB is being operated in the normal mode. The result of the calibration process is a CMFB circuit with improved $g_A/g_B$ matching which results in a significantly decreased (i.e., improved) conversion factor, $Z_{CD}$.

Figure 8:
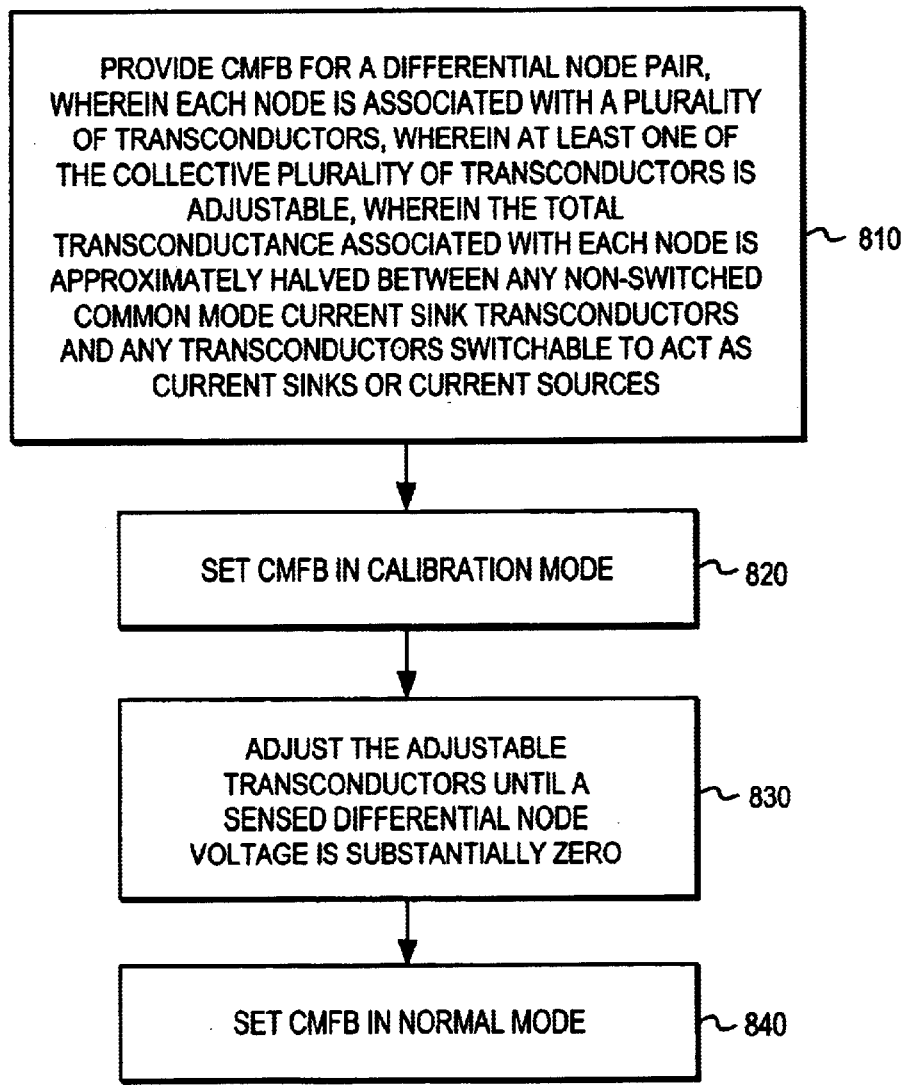
FIG. 8 illustrates a method of calibrating a common mode feedback block for differential node circuitry.

FIG. 8 illustrates the method of calibration a differential circuit incorporating a CMFB circuit. A CMFB circuit having a plurality of transconductive elements associated with each node of a differential pair is provided in step 810. The collective plurality of transconductive elements includes at least one adjustable transconductor. Generally, the transconductance associated with the plurality is nominally halved between the transconductors capable of being decoupled from the same associated node and recoupled to the complementary differential node and the remaining transconductors for the plurality associated with that node. In particular, the nominal transconductance provided by the plurality of transconductors associated with any given node is nominally halved between the transconductors capable of being switched to act as calibration mode current sources and the remaining transconductors which act as common mode feedback current sinks.

In step 820, the CMFB circuit is placed into calibration mode. While in calibration mode a subset of the plurality of transconductive elements associated with each differential node are effectively swapped to be associated with the respective complementary node. The remaining transconductors continue to operate as common mode feedback current sinks while the swapped transconductors operate as adjustable current sources. The control signal source for the remaining transconductors is independent from the control signal source for the swapped transconductors during calibration.

In step 830, the calibration engine senses $V_{AB}$ and adjusts $g_1$ and $g_2$ until $V_A=V_B$ such that $V_{AB}=0$ without the use of precisely matched current sources. In one embodiment, the calibration engine relies upon the sensed differential voltage at the same pre-determined frequency as the control signal source for the adjustable transconductors. During calibration, the swapped adjustable transconductors operate as current sources and are adjusted to offset the transconductors associated with their respective ordinarily complementary nodes (i.e., complementary to their respective associated nodes as determined before swappping).

In step 840, the CMFB circuit is then placed into normal operational mode by toggling the switches. In normal mode, the adjusted values for the adjustable transconductors are fixed to prevent further manipulation or adjustment. Thus, for example, the register values may not be freely updated during normal operation.

In one embodiment, the improved CMFB and calibration process is applied to achieve a specified longitudinal balance in a subscriber loop application. Thus, for example, the CMFB may be used to longitudinally balance the tip and ring lines of the subscriber loop to substantially eliminate common mode signals and the effect of any such signals in the differential processing of the voltage and currents sensed from the tip and ring lines.

In one embodiment, the improved CMFB is implemented on an integrated circuit semiconductor die. The calibration engine is likewise implemented on the integrated circuit semiconductor die. In one embodiment, the improved CMFB and calibration engine are fabricated using complementary metal oxide semiconductor (CMOS) logic.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A common mode feedback circuit apparatus comprising:
   a first and a second node defining a differential node pair; and
   a collective plurality of transconductors including a first plurality of transconductors associated with the first node and a second plurality of transconductors associated with the second node, wherein at least one transconductor of the collective plurality has an adjustable transconductance, wherein a total transconductance of each of the first and second pluralities is nominally halved between any adjustable transconductors and remaining transconductors of that plurality.

2. The apparatus of claim 1 wherein the total transconductance of each of the first and second pluralities is nominally halved between the set of transconductors capable of being decoupled from its associated node and recoupled to a complementary node and the remaining transconductors of that plurality.

3. The apparatus of claim 1 wherein each of the first and second plurality of transconductors includes at least one transconductor with an adjustable transconductance.

4. The apparatus of claim 3 further comprising:
   a calibration engine, wherein while in a calibration mode the calibration engine varies each of the adjustable transconductances until a sensed differential voltage across the differential node pair is substantially zero.

5. The apparatus of claim 4 further comprising:
   a calibration signal voltage source; and
   a plurality of switches for switching between a calibration mode and a normal mode, wherein while in calibration mode the switches couple a common mode voltage signal from a common mode node to non-adjustable transconductors of the first and second pluralities, wherein the switches couple each of the adjustable transconductors to their complementary nodes, wherein the switches couple the calibration signal voltage source to the adjustable transconductors, wherein a current generated by the adjustable transconductors is proportional to the calibration signal voltage source, wherein the calibration signal voltage source is independent of the common mode voltage signal.

6. The apparatus of claim 5 wherein while in normal mode the plurality of switches decouple the adjustable transconductors from the calibration signal voltage source, decouple the adjustable transconductors from their complementary nodes, and couple the adjustable transconductors to their respective associated differential nodes.

7. The apparatus of claim 1 wherein each of the first plurality and second plurality comprises 2 transconductors.

8. The apparatus of claim 7 wherein every transconductor of the collective plurality has substantially a same nominal transconductance value.

9. The apparatus of claim 1 wherein the circuitry is implemented on an integrated circuit semiconductor die.

10. The apparatus of claim 9 wherein the integrated circuit is a complementary metal oxide semiconductor (CMOS) integrated circuit.

11. The apparatus of claim 1 further comprising:

a calibration engine, wherein the calibration engine varies the adjustable transconductance of the at least one transconductor until a sensed differential voltage across the differential node pair is substantially zero.

12. The apparatus of claim 11 wherein the calibration engine further comprises a band pass filter to sense the differential voltage at a predetermined frequency.

13. A method of calibrating a common mode feedback block circuit, comprising the steps of:

a) providing a common mode feedback block apparatus having a first node and a second node forming a differential node pair, the apparatus further comprising a collective plurality of transconductors including a first plurality of transconductors associated with the first node and a second plurality of transconductors associated with the second node, the collective plurality including at least one adjustable transconductor; and b) adjusting the at least one adjustable transconductor until a differential voltage across the differential node pair is substantially zero.

14. The method of claim 13 wherein step b) is performed while the common mode feedback block is in a calibration mode.

15. The method of claim 13 wherein step b) further comprises the step of sensing the differential voltage only at a pre-determined frequency.

16. The method of claim 13 further comprising the step of:

c) switching the common mode feedback block to a normal mode to prevent further transconductance adjustments to the at least one adjustable transconductor.

17. The method of claim 13 wherein each of the first and second nodes has at least one associated adjustable transconductor, wherein step b) further includes the step of adjusting each of the associated adjustable transconductors until the differential voltage across the differential node pair is substantially zero.

18. The method of claim 17 wherein the adjustable transconductors are adjusted by increasing a transconductance of a transconductor associated with the first node by an amount $\delta$ and decreasing a transconductance of a transconductor associated with the second node by the amount $\delta$.

19. The method of claim 13 further comprising the step of:

c) providing a calibration signal source independent of a common mode node, wherein during calibration the calibration signal source provides a control voltage for any adjustable transconductor, wherein the common mode node provides the control voltage for the remaining transconductors of the collective plurality of transconductors.

20. The method of claim 19 wherein the calibration signal source and the common mode feedback block reside on a same integrated circuit die.

* * * * *